(12) United States Patent
Ozaki et al.

(10) Patent No.: US 12,127,330 B2
(45) Date of Patent: Oct. 22, 2024

(54) ELECTRONIC CONTROL DEVICE

(71) Applicant: HITACHI ASTEMO, LTD., Hitachinaka (JP)

(72) Inventors: Kiyoharu Ozaki, Hitachinaka (JP); Toshiaki Takai, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 231 days.

(21) Appl. No.: 17/783,204

(22) PCT Filed: Dec. 4, 2020

(86) PCT No.: PCT/JP2020/045178
§ 371 (c)(1),
(2) Date: Jun. 7, 2022

(87) PCT Pub. No.: WO2021/131599
PCT Pub. Date: Jul. 1, 2021

(65) Prior Publication Data
US 2023/0017402 A1    Jan. 19, 2023

(30) Foreign Application Priority Data
Dec. 27, 2019  (JP) ................................. 2019-238070

(51) Int. Cl.
*H05K 5/00*  (2006.01)
*H05K 1/02*  (2006.01)
(52) U.S. Cl.
CPC ......... *H05K 1/0216* (2013.01); *H05K 5/0026* (2013.01)
(58) Field of Classification Search
CPC ............... H05K 1/0216; H05K 5/0026; H05K 2201/10371; H05K 9/0039
See application file for complete search history.

(56) References Cited

U.S. PATENT DOCUMENTS 6,573,804 B2 *   6/2003  Hayashi .................. H01L 23/64
                                                                      333/32
7,438,560 B2 *  10/2008  Takahashi ............ H05K 1/0239
                                                                      439/70

(Continued)

FOREIGN PATENT DOCUMENTS

JP      9-283962 A    10/1997
JP   2000-286587 A    10/2000

(Continued)

OTHER PUBLICATIONS

International Search Report and Written Opinion with English translation issued in corresponding international application PCT/JP2020/045178.

*Primary Examiner* — Anthony Q Edwards
*Assistant Examiner* — Hung Q Dang
(74) *Attorney, Agent, or Firm* — Foley & Lardner LLP

(57) ABSTRACT

Leakage of radio-frequency radiation noise radiated from a noise source to the outside is suppressed. An electronic control device 1 includes a printed board 101 having signal grounds 104a, 104b, and 104c, and a frame ground 103a, a housing 100 accommodating the printed board 101, and a connector 105 mounted on the printed board 101. The electronic control device 1 includes a first coupling portion 301 that AC-couples the signal ground 104a with the frame ground 103a and a second coupling portion 301 that electrically couples the frame ground 103a with the housing 100, and the first coupling portion 301 and the second coupling portion 301 are provided between the connector 105 and an electronic circuit 110 on the printed board 101.

8 Claims, 18 Drawing Sheets

(56) References Cited

U.S. PATENT DOCUMENTS

| | | | |
|---|---|---|---|
| 8,530,750 B2* | 9/2013 | Koyama | H05K 1/0216 |
| | | | 174/258 |
| 11,246,246 B2* | 2/2022 | Ohkubo | H05K 5/04 |
| 11,758,643 B2* | 9/2023 | Kobayashi | H05K 1/0259 |
| | | | 361/753 |
| 2002/0114134 A1 | 8/2002 | Skinner et al. | |
| 2020/0045815 A1* | 2/2020 | Ito | H05K 5/04 |
| 2022/0354006 A1* | 11/2022 | Nakamura | H05K 1/181 |

FOREIGN PATENT DOCUMENTS

| | | | | |
|---|---|---|---|---|
| JP | 2014-036138 A | | 2/2014 | |
| JP | WO2018/173263 | * | 9/2018 | H05K 1/02 |

* cited by examiner

ELECTRONIC CONTROL DEVICE

TECHNICAL FIELD

The present invention relates to an electronic control device.

BACKGROUND ART

In recent years, a driving assistance system including a vehicle collision damage reduction brake, automatic driving, and the like have been studied for widespread use. There is a demand for an electronic control device mounted on such a vehicle to have calculation performance. In order to meet this demand, it is necessary to mount a semiconductor chip such as a CPU having a high operation frequency on the electronic control device.

On the other hand, unnecessary electromagnetic radiation (noise) is generated from the electronic control device on which the semiconductor chip having a high operation frequency is mounted.

As a technique for suppressing radiation noise, for example, PTL 1 discloses an electronic control device that confines radiation noise by connecting a partition wall inside a housing, a frame ground of a circuit board having a signal ground and the frame ground, and a cover with metal screws.

CITATION LIST

Patent Literature

PTL 1: WO2019/181290A

SUMMARY OF INVENTION

Technical Problem

In the related art of PTL 1, in the electronic control device having a connector mounted thereon, the signal ground of the circuit board is often connected to the outside via the connector, and thus, there is a concern that radiation noise generated by a potential difference between the signal ground and the frame ground leaks to the outside of the electronic control device through the connector.

The present invention has been made in view of the above circumstances, and an object of the present invention is to provide an electronic control device capable of suppressing leakage of radio-frequency radiation noise radiated from a noise source to the outside.

Solution to Problem

In order to solve the above object, an electronic control device according to the present invention is an electronic control device which includes a circuit board having signal grounds and frame grounds, a housing accommodating the circuit board, and a connector mounted on the circuit board. The device includes a first coupling portion which AC-couples the signal ground with the frame ground, and a second coupling portion which electrically couples the frame ground with the housing. The first coupling portion and the second coupling portion are provided between the connector and a noise source on the circuit board.

Advantageous Effects of Invention

According to the electronic control device of the present invention, it is possible to prevent noise caused by an operation of an electronic component from leaking to the outside of the electronic control device.

DESCRIPTION OF EMBODIMENTS

Hereinafter, embodiments of the present invention will be described with reference to the drawings. In the following description, although an electronic control device (so-called in-vehicle electronic control device) used in a vehicle or the like is exemplified, the present invention may be applied to an electronic control device other than the in-vehicle electronic control device. In the following description, when there are a plurality of identical constituent elements, an alphabet may be added to an end of a reference sign (numeral), but the plurality of constituent elements may be collectively denoted by omitting the alphabet. That is, for example, when there are signal grounds 104a, 104b, and 104c of an identical printed board, these signal grounds may be collectively referred to as a signal ground 104 of the printed board.

First Embodiment

A first embodiment of the present invention will be described with reference to FIGS. 1 to 4.

Figure 1:
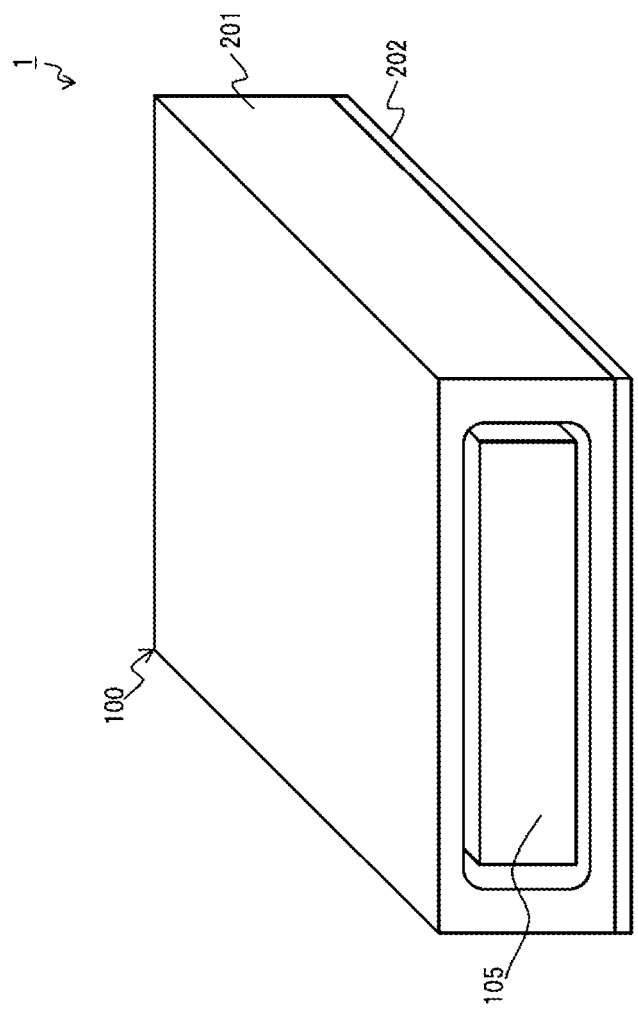
FIG. 1 is a perspective view schematically illustrating an external appearance of an electronic control device according to a first embodiment.
Figure 2:
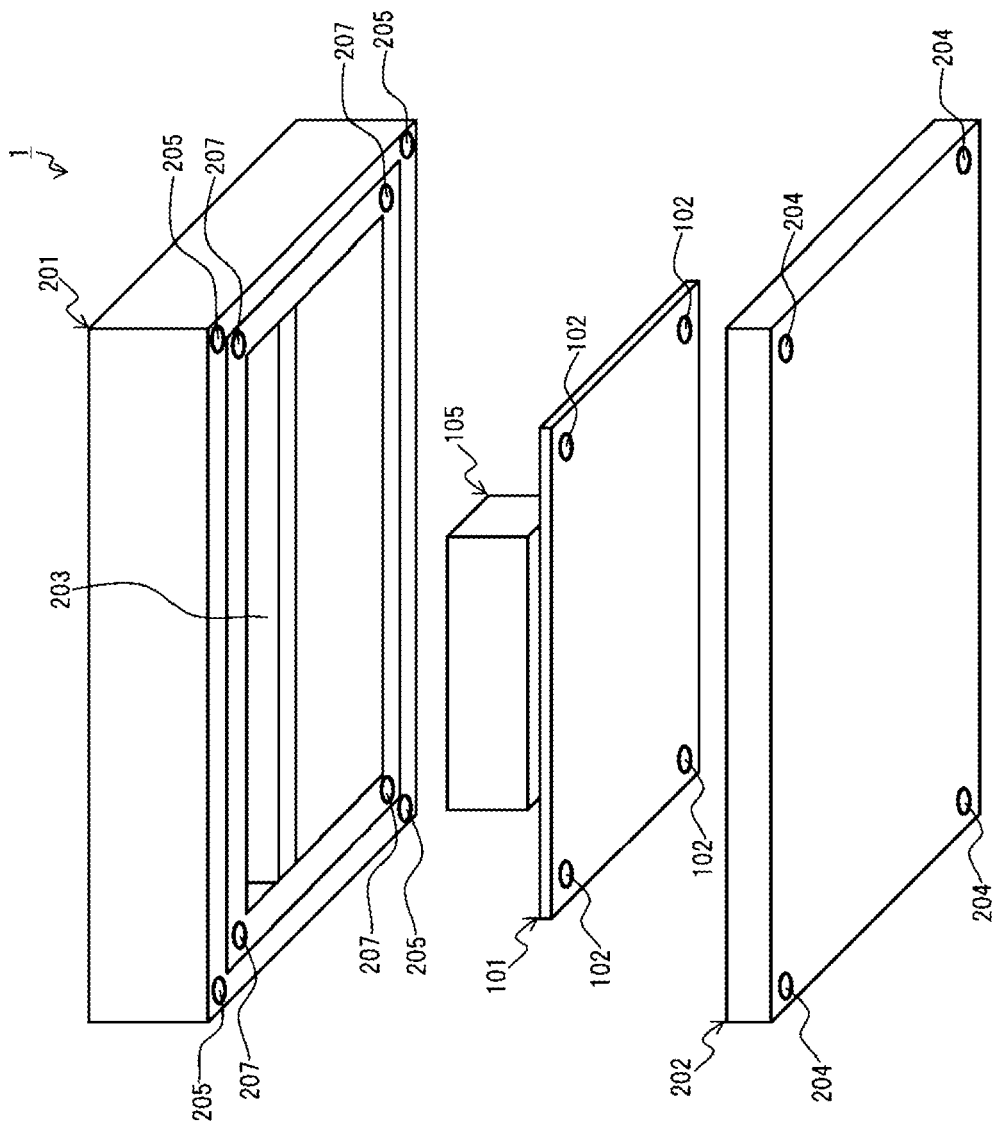
FIG. 2 is an exploded perspective view of the electronic control device according to the first embodiment.
Figure 3:
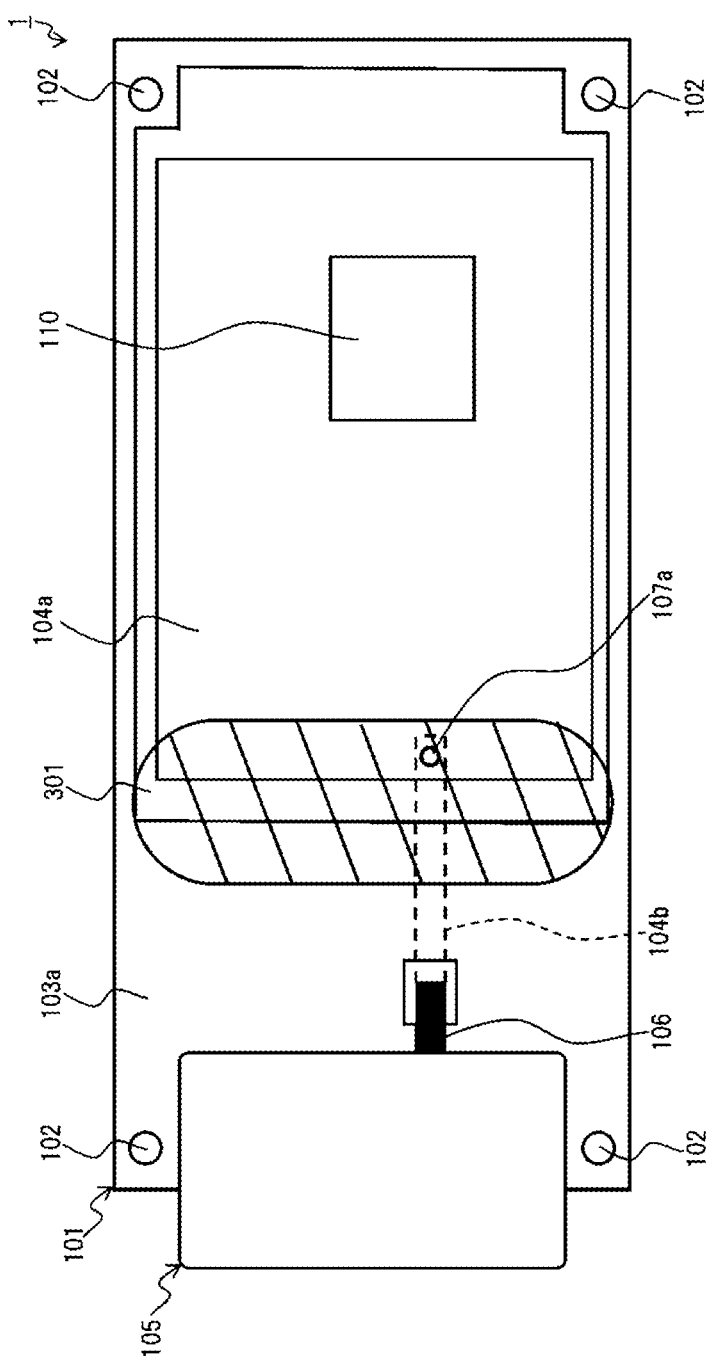
FIG. 3 is a top view of a board of the electronic control device according to the first embodiment.
Figure 4:
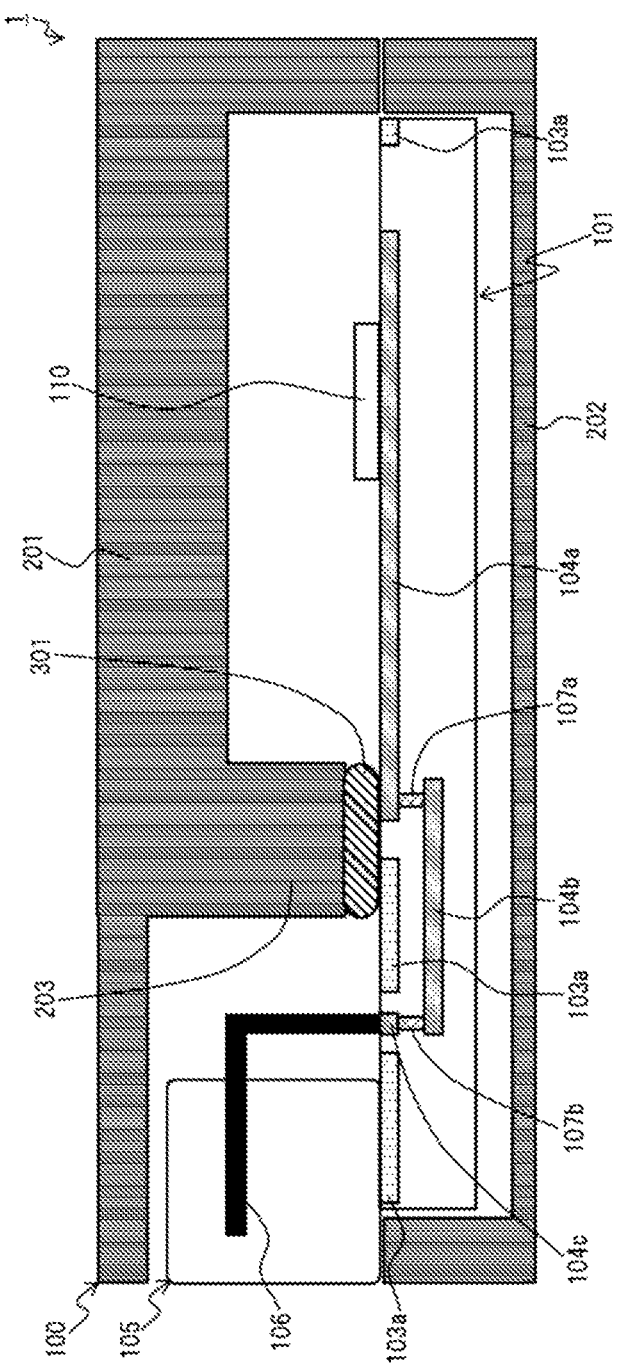
FIG. 4 is a cross-sectional view in a plane along a connector pin of the electronic control device according to the first embodiment.

FIG. 1 is a perspective view schematically illustrating an external appearance of an electronic control device according to the present embodiment, FIG. 2 is an exploded perspective view, FIG. 3 is a top view of a printed board, and FIG. 4 is a cross-sectional view in a plane along a connector pin of the electronic control device.

As illustrated in FIGS. 1 to 4, an electronic control device 1 includes a printed board 101 as an example of a "circuit board" on which electronic components are mounted, a metal housing 100 that encloses the printed board 101, and a connector 105 that is mounted on the printed board 101 and supplies power and communicates with the outside. As illustrated in FIGS. 3 and 4, an electronic circuit 110 as an example of a "noise source" is mounted on the printed board 101. The printed board 101 includes the connector 105 for exchanging signals related to the electronic circuit 110 with the outside of the housing.

The printed board 101 is formed in a multilayer structure having a ground (so-called signal ground 104) serving as a reference potential for driving in the electronic circuit 110 and a ground (so-called frame ground 103) provided to be DC-cut off from the signal ground 104. The electronic circuit 110 is mounted on one surface side (upper surface side) of the printed board 101. Hereinafter, for the sake of simplicity of explanation, for example, an upper surface of the printed board 101 in FIG. 2 is referred to as an upper surface, and a lower surface thereof is referred to as a lower surface.

The electronic circuit 110 is, for example, a control processor, a large scale integration (LSI), a controller area network (CAN) transceiver, a field programmable gate array (FPGA), a memory, an Ethernet (registered trademark) transceiver, a power supply circuit for driving these components, and the like. The electronic circuit 110 is mounted on one side (right side in FIGS. 3 and 4) of the upper surface of the printed board 101 by solder bonding or the like. The electronic circuit 110 may be a radio-frequency driving microcomputer.

The connector 105 is used for inputting the power, the ground (signal ground 104), and the like and transmitting and receiving a communication signal of the CAN between the printed board 101 and the outside of the housing 100, and is made of, for example, resin. The connector 105 is mounted on the same upper surface of the printed board 101 as the electronic circuit 110 and on the other end portion (left end portion in FIGS. 3 and 4) on an opposite side of the electronic circuit 110 by solder bonding or the like.

The housing 100 includes a metal base 201 disposed so as to cover the printed board 101 from one surface side (that is, the upper surface side), and a metal cover 202 disposed so as to cover printed board 101 from the other surface side (that is, the lower surface side) together with the metal base 201.

The metal base 201 has, for example, a rectangular parallelepiped outer shape having a space for accommodating the printed board 101 on the lower surface side. As illustrated in FIG. 2, a plurality of fixing holes (screw holes) 205 for fixing the metal cover 202 through metal screws are provided at four corners of a lower surface of the metal base 201. The metal cover 202 has, for example, a rectangular outer shape corresponding to the metal base 201. A plurality of fixing holes (screw holes) 204 for fixing to the metal base 201 are provided at positions corresponding to the fixing holes 205 at the four corners of the metal cover 202. The metal cover 202 is fixed to the metal base 201 by fixing the fixing holes 204 of the metal cover 202 and the fixing holes 205 of the metal base 201 with metallic screws.

A plurality of fixing holes (screw holes) 207 for fixing the printed board 101 are provided inside the fixing holes 205 on the lower surface of the metal base 201. A plurality of fixing holes 102 (screw holes) for fixing to the metal base 201 are provided at positions corresponding to the fixing holes 207 of the printed board 101. The printed board 101 is fixed to the metal base 201 by fixing the fixing holes 102 of the printed board and the fixing holes 207 of the metal base 201 with metallic screws.

The fixing holes 102 of the printed board 101 are connected to the frame ground 103 in the printed board 101. That is, the frame ground 103 of the printed board 101 and the metal base 201 are electrically coupled with a metallic screw.

A partition wall 203 as an example of a "protrusion portion" protruding toward the inside of the housing 100 when the partition wall is assembled as the housing 100 is provided substantially at a center of an inner surface of the metal base 201. The partition wall 203 is disposed between the connector 105 and the electronic circuit 110. The partition wall 203 separates the inside of the housing 100 into a space in which the electronic circuit 110 is disposed and a space in which the connector 105 is disposed on at least one surface side (here, the upper surface side) of the printed board 101.

In the present embodiment, the partition wall 203 is formed integrally with the metal base 201.

However, the present invention is not limited thereto, and the partition wall 203 formed separately from the metal base 201 may be combined later. The advantage of integrally molding the partition wall 203 and the metal base 201 is that since a gap between the partition wall 203 and the metal base 201 can be suppressed, a noise attenuation effect can be enhanced and manufacturing cost can be reduced.

A capacitive coupling member 301 as an example of a "first coupling portion" and a "second coupling portion" is provided between the partition wall 203, the frame ground 103a of the printed board 101, and the signal ground 104a of the printed board 101. The capacitive coupling member 301 may be, for example, a grease or a dielectric radio wave absorbing sheet. The capacitive coupling member 301 AC-couples the signal ground 104a with the frame ground 103a of the printed board 101, and electrically couples the frame ground 103 of the printed board 101 with the housing 100. As a result, it is possible to attenuate a radiation noise propagated to the connector 105 side among radiation noises radiated to an internal space of the housing 100 by driving the electronic circuit 110. In other words, the partition wall 203, the frame ground 103a of the printed board 101, the signal ground 104a of the printed board 101, and the capacitive coupling member 301 constitute a suppression unit that suppresses noise radiated from the electronic circuit 110 to the connector 105.

Specifically, in a state where the printed board 101 is fixed to the metal base 201, a gap (clearance) is provided between the partition wall 203 and the printed board 101 such that the partition wall 203 does not come into contact with the printed board 101 and the electronic components mounted on the printed board 101. The capacitive coupling member 301 is provided in a gap between a lower side of the partition wall 203 and the upper surface of the printed board 101. In FIGS. 3 and 4, a position corresponding to the capacitive coupling member 301 is indicated by an oblique line with reference sign 301.

Specifically, in a projection region of the partition wall 203 in the printed board 101, an end portion of signal ground 104a of the printed board 101 and an end portion of the frame ground 103a of the printed board 101 are disposed. The signal ground 104a of the printed board 101 and the frame ground 103a of the printed board 101 are AC-coupled by the capacitive coupling member 301 in the projection region of the partition wall 203 in the printed board 101. The signal ground 104a is connected to the signal ground 104b formed in an inner layer of the printed board 101 by a via 107a formed in the projection region of the partition wall 203 in the printed board 101. The signal ground 104b is connected to the signal ground 104c formed on the upper surface of the printed board 101 via a via 107b formed between the partition wall 203 and the connector 105. The signal ground 104c is connected to a connector pin 106 of the connector pin 106 by solder bonding or the like. In FIG. 3, a position corresponding to the signal ground 104b formed in the inner layer of the printed board 101 is indicated by a dotted line with reference sign 104b.

In FIG. 2 and the like of the present embodiment, for example, although a cutout for avoiding the connector 105 is provided in the metal base 201 at a position corresponding to the connector 105 after the housing 100 is assembled, the illustration is omitted for the sake of simplicity in explanation. In FIG. 3 and the like of the present embodiment, for example, since the drawings become complicated, a part of the connector pin and a part of a wiring formed on the printed board 101 are omitted.

Effects of the present embodiment having the above-described configuration will be described.

In the related art, it is necessary to mount an electronic circuit (semiconductor device or a radio-frequency circuit) having a high operation frequency in the electronic control device of the vehicle along with an increase in required calculation performance. It is necessary to provide a connector for connecting with an external device in the electronic control device. Since the connector is large in size and is often made of resin, there is a concern that radiation noise from the electronic circuit leaks to the outside of the electronic control device via the connector. On the other hand, there is also an electronic control device having a structure in which radiation noise is confined by providing the partition wall inside the housing and connecting the partition wall with the frame ground of the printed board with the metallic screw. However, in the electronic control device having the connector mounted thereon, the signal ground of the printed board is often connected to the outside via the connector, and there is a concern that radiation noise generated by a potential difference between the signal ground and the frame ground leaks to the outside of the electronic control device through the connector.

On the other hand, in the present embodiment, the single capacitive coupling member 301 AC-couples the partition wall 203, the frame ground 103a of the printed board 101, and the signal ground 104a of the printed board 101 in the projection region of the partition wall 203 in the printed board 101. As a result, the partition wall 203, the frame ground 103a of the printed board 101, and the signal ground 104a of the printed board 101 can be set to the same potential at a radio frequency with a simple configuration, that is, a noise electric field can be suppressed. Accordingly, it is possible to suppress the leakage of the radiated noise of the radio frequency radiated from the electronic circuit 110 to the outside.

Second Embodiment

Hereinafter, a second embodiment of the present invention will be described with reference to FIGS. 5 and 6. In the present embodiment, only differences from the first embodiment will be described, and in the drawings used in the present embodiment, the same members as the members of the first embodiment are denoted by the same reference signs, and description thereof will be omitted.

An electronic control device 2 of the present embodiment forms a signal ground 104 and a frame ground 103 of a printed board 101 in a comb shape in a projection region of a partition wall 203.

Figure 5:
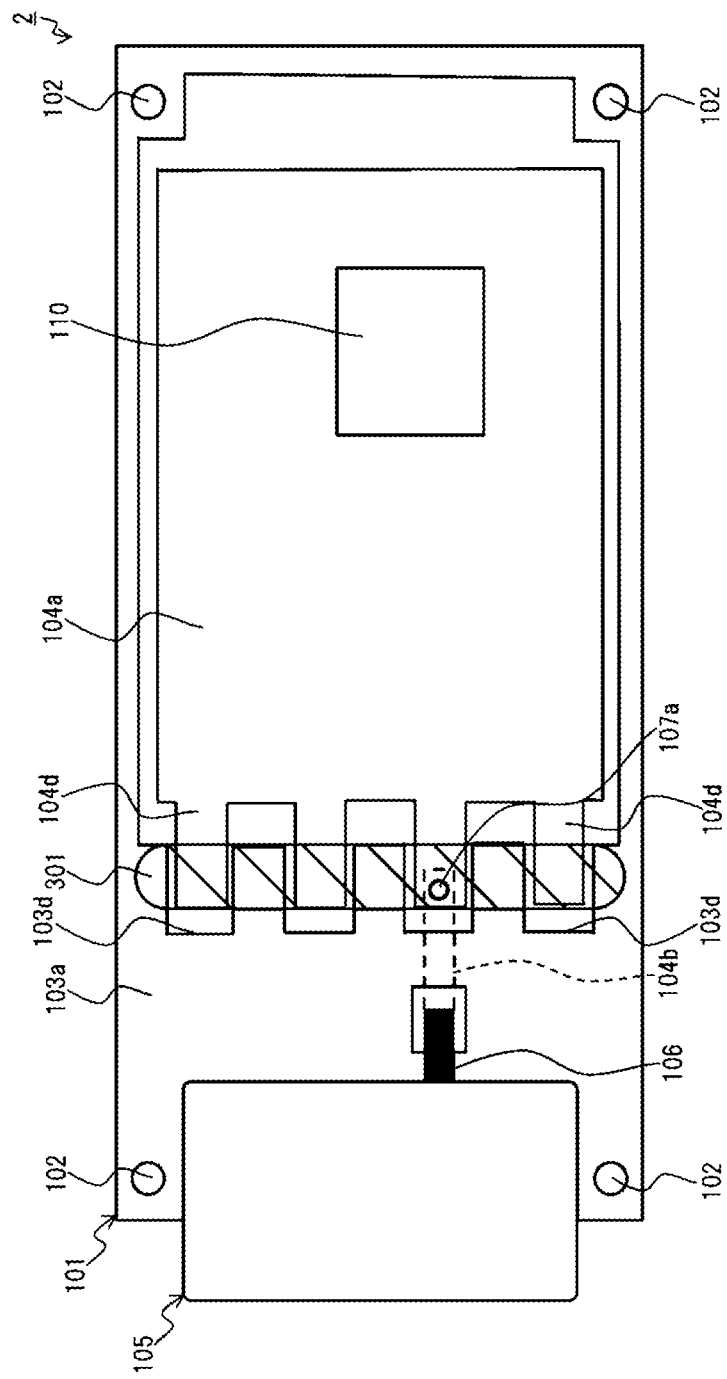
FIG. 5 is a top view of a board of an electronic control device according to a second embodiment.
Figure 6:
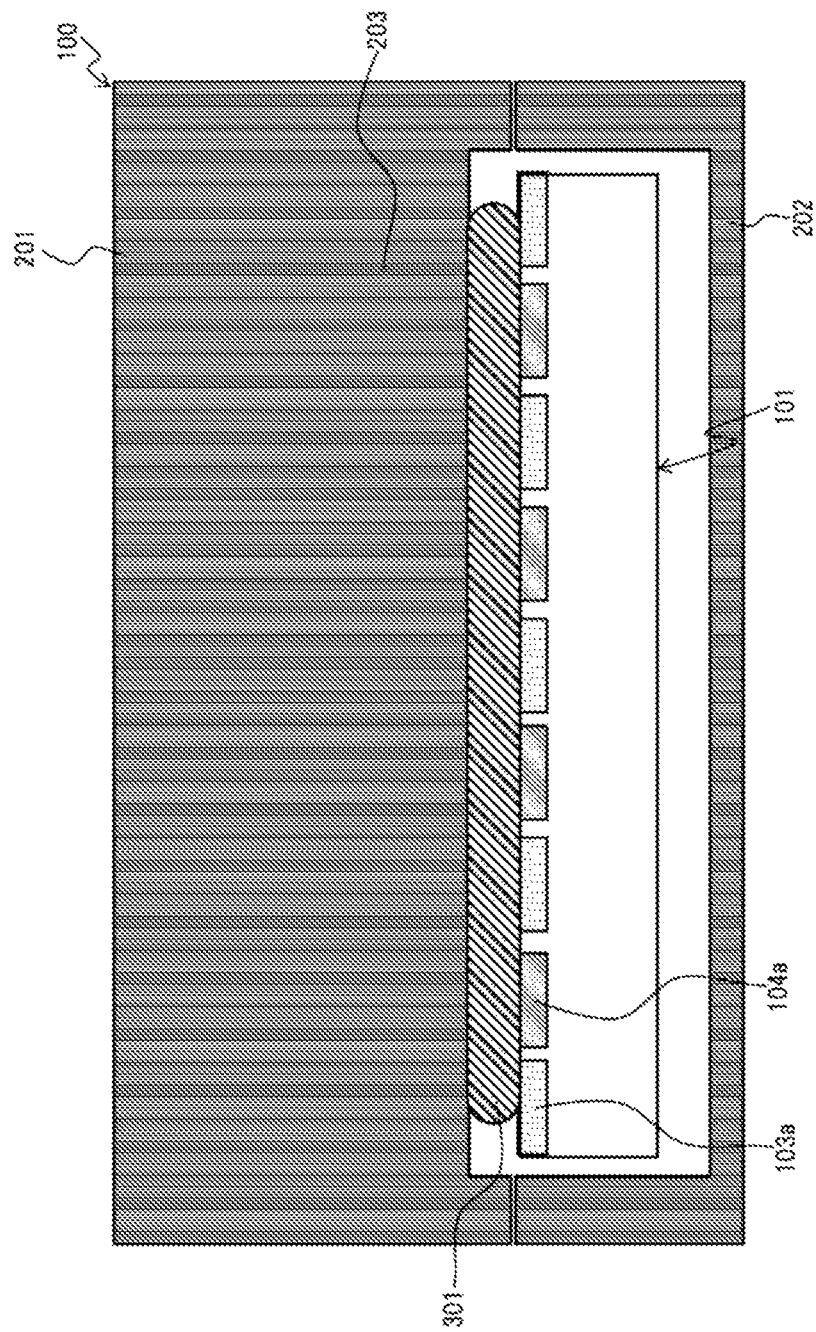
FIG. 6 is a cross-sectional view in a plane along a partition wall of the electronic control device according to the second embodiment.

FIG. 5 is a top view of the printed board of the electronic control device according to the present embodiment, and FIG. 6 is a cross-sectional view in a plane along the partition wall of the electronic control device.

In the electronic control device 2, in in the projection region of the partition wall 203, a plurality of convex portions 104d are provided in the signal ground 104a of the printed board 101, and a plurality of concave portions 103d into which the convex portions 104d is insertable are provided in the frame ground 103a of the printed board 101. The convex portions 104d of the signal ground 104a of the printed board 101 and the concave portions 103d of the frame ground 103a of the printed board 101 are formed in a comb shape, and the partition wall 203, the signal ground 104a of the printed board 101, and the frame ground 103a of the printed board 101 are AC-coupled by a capacitive coupling member 301 provided between the partition wall and the printed board 101 in the projection region of the partition wall 203.

Other configurations are similar to the configurations of the first embodiment. In the present embodiment, a plurality of convex portions may be provided in the frame ground 103a of the printed board 101, and a plurality of concave portions into which the convex portions is insertable may be provided in the signal ground 104a of the printed board 101.

In the present embodiment having the above-described configuration, the same effects as the effects of the first embodiment can be obtained.

As compared with the first embodiment, the signal ground 104a of the printed board 101 and the frame ground 103a of the printed board 101 are formed in the comb shape, and thus, it is possible to suppress a width of an application region of the capacitive coupling member 301. Accordingly, since it is possible to reduce the required amount of the capacitive coupling member 301 as compared with the first embodiment, the cost can be reduced. There is also an advantage that the electronic control device 1 can be downsized in a width direction of the capacitive coupling region.

Third Embodiment

A third embodiment of the present invention will be described with reference to FIGS. 7 to 9. In the present embodiment, only differences from the first embodiment will be described, and in the drawings used in the present embodiment, the same members as the members of the first embodiment are denoted by the same reference signs, and description thereof will be omitted.

In an electronic control device 3 of the present embodiment, a partition wall 203 and a frame ground 103 of a printed board 101 are DC-coupled by conductive gaskets 302 as an example of a "DC coupling member", and the frame ground 103a of the printed board 101 and a signal ground 104b of an inner layer of the printed board 101 are AC-coupled.

Figure 7:
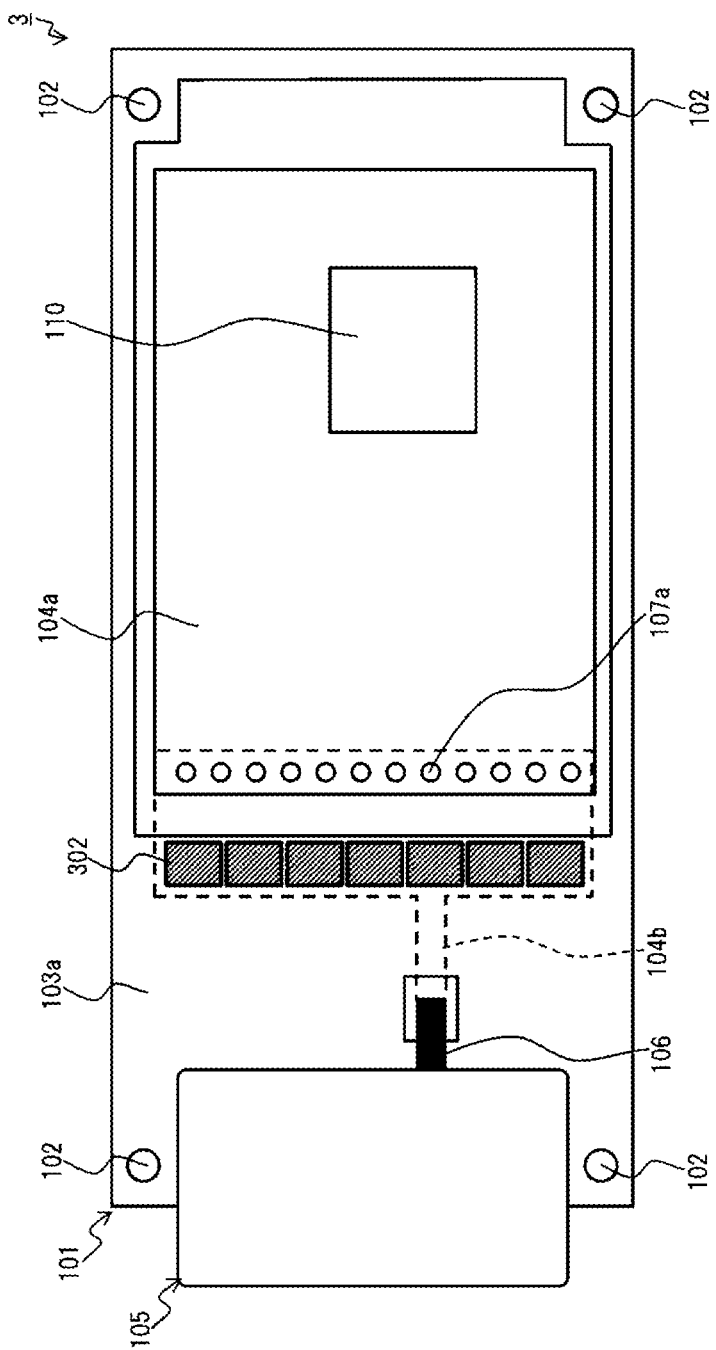
FIG. 7 is a top view of a board of an electronic control device according to a third embodiment.
Figure 8:
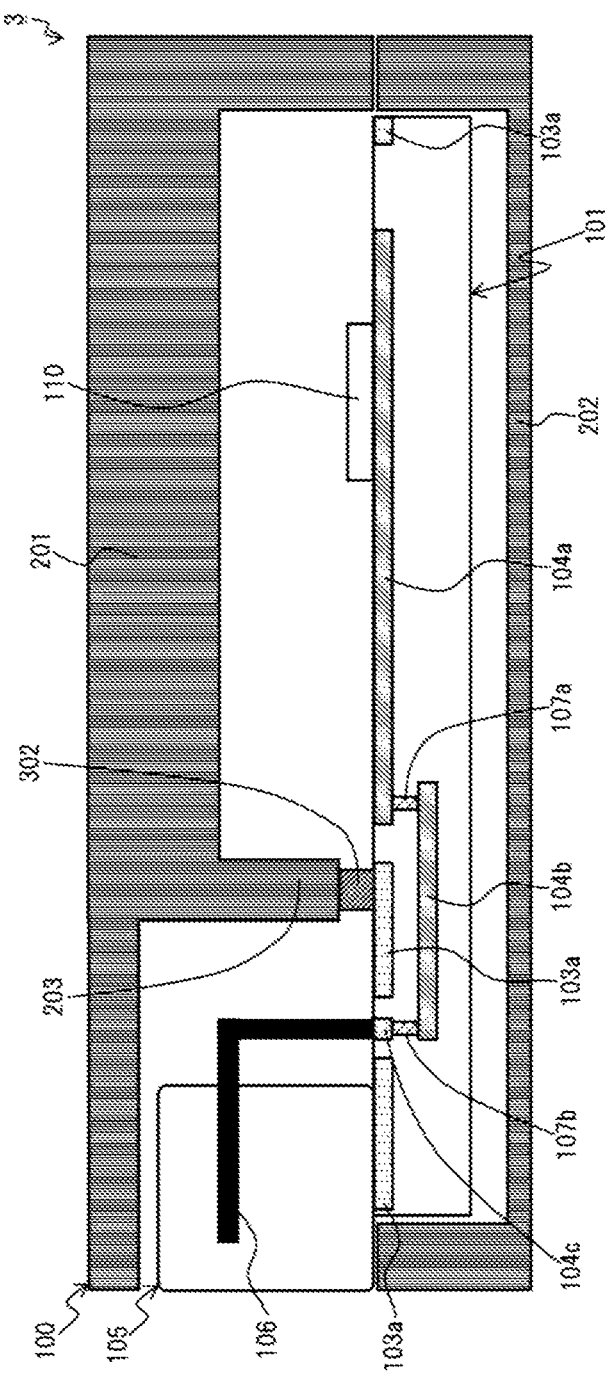
FIG. 8 is a cross-sectional view in a plane along a connector pin of the electronic control device according to the third embodiment.
Figure 9:
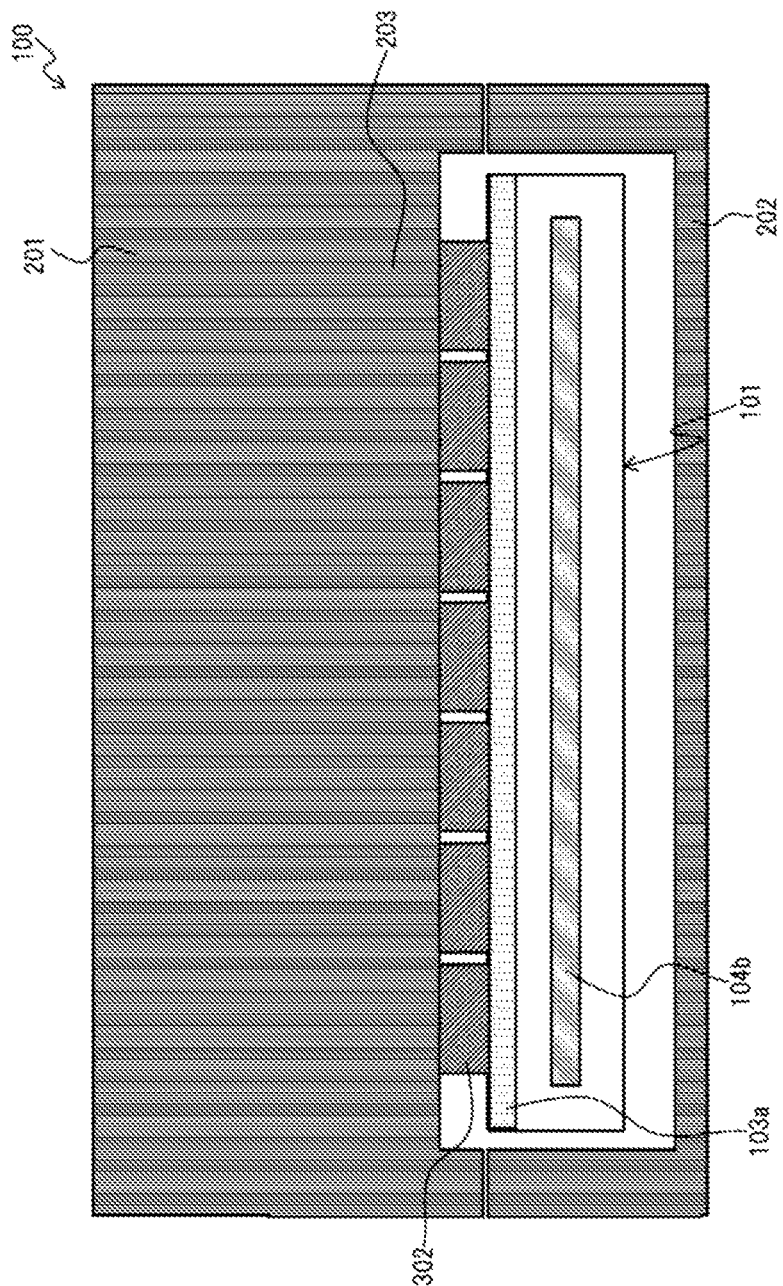
FIG. 9 is a cross-sectional view in a plane along a partition wall of the electronic control device according to the third embodiment.

FIG. 7 is a top view of the printed board of the electronic control device according to the present embodiment, FIG. 8 is a cross-sectional view in a plane along a connector pin of the electronic control device, and FIG. 9 is a cross-sectional view in a plane along the partition wall of the electronic control device.

The electronic control device 3 DC-couples the partition wall 203 with the frame ground 103a of the printed board 101 with the conductive gaskets 302. The electronic control device 3 forms a capacitance in the printed board 101 and AC-couples the frame ground with the signal ground by slightly separating the frame ground 103a of the printed board 101 and the signal ground 104b of the inner layer of the printed board 101 from each other in the projection region of the partition wall 203.

As a result, in the projection region of the partition wall 203, the leakage of the radiation noise to the outside can be suppressed by a noise shielding effect by DC coupling between the partition wall 203 and the frame ground 103a of the printed board 101 and a noise electric field suppression effect by AC coupling between the frame ground 103a of the printed board 101 and the signal ground 104b of the inner layer of the printed board 101.

Other configurations are similar to the configurations of the first embodiment.

In the present embodiment having the above-described configuration, the same effects as the effects of the first embodiment can be obtained.

As compared with the first embodiment, since the AC coupling between the signal grounds 104a, 104b, and 104c of the printed board 101 and the frame ground 103a of the printed board 101 can be realized without providing an additional member (capacitive coupling member) by devising a wiring layout of the printed board 101, the cost can be reduced.

Fourth Embodiment

Hereinafter, a fourth embodiment of the present invention will be described with reference to FIGS. 10 and 11. In the present embodiment, only differences from the third embodiment will be described, and in the drawings used in the present embodiment, the same members as the members of the third embodiment are denoted by the same reference signs, and description thereof will be omitted.

In an electronic control device 4 of the present embodiment, an arrangement interval between conductive gaskets 302 is shorter than ½ of a wavelength of the radiation noise.

Figure 10:
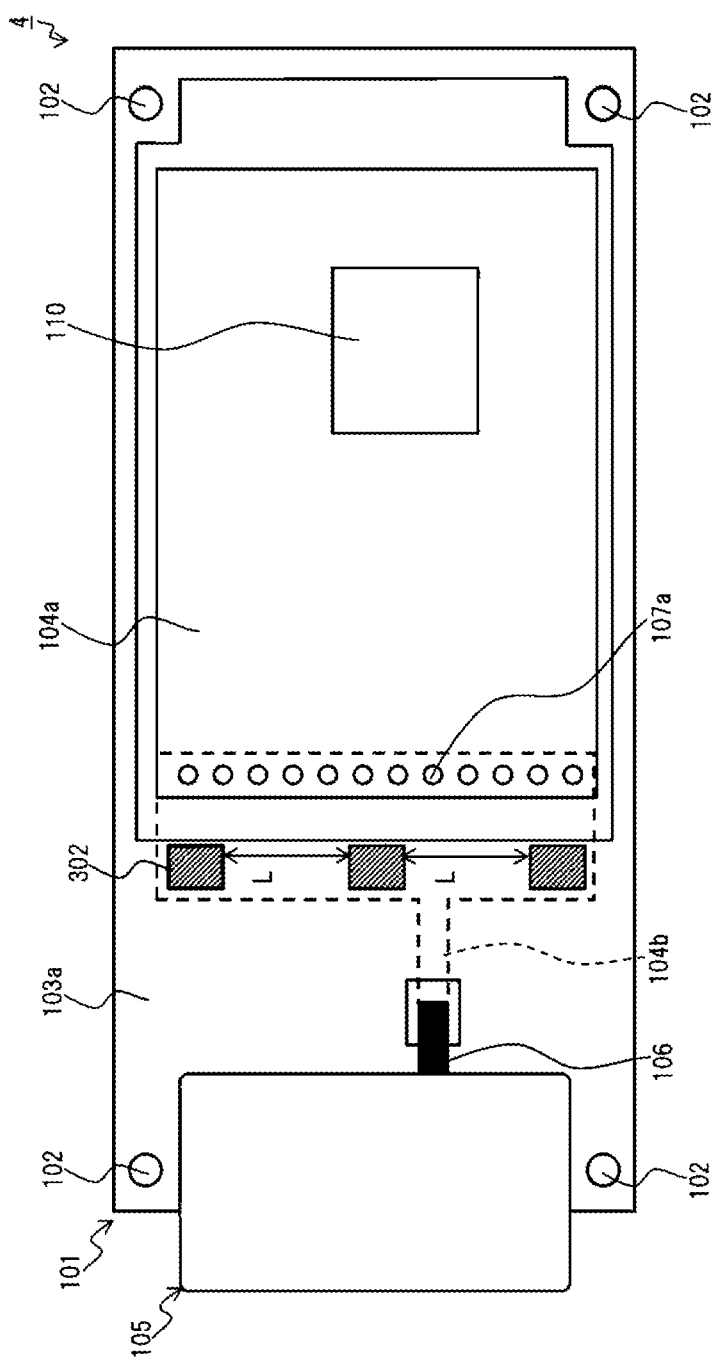
FIG. 10 is a top view of a board of an electronic control device according to a fourth embodiment.
Figure 11:
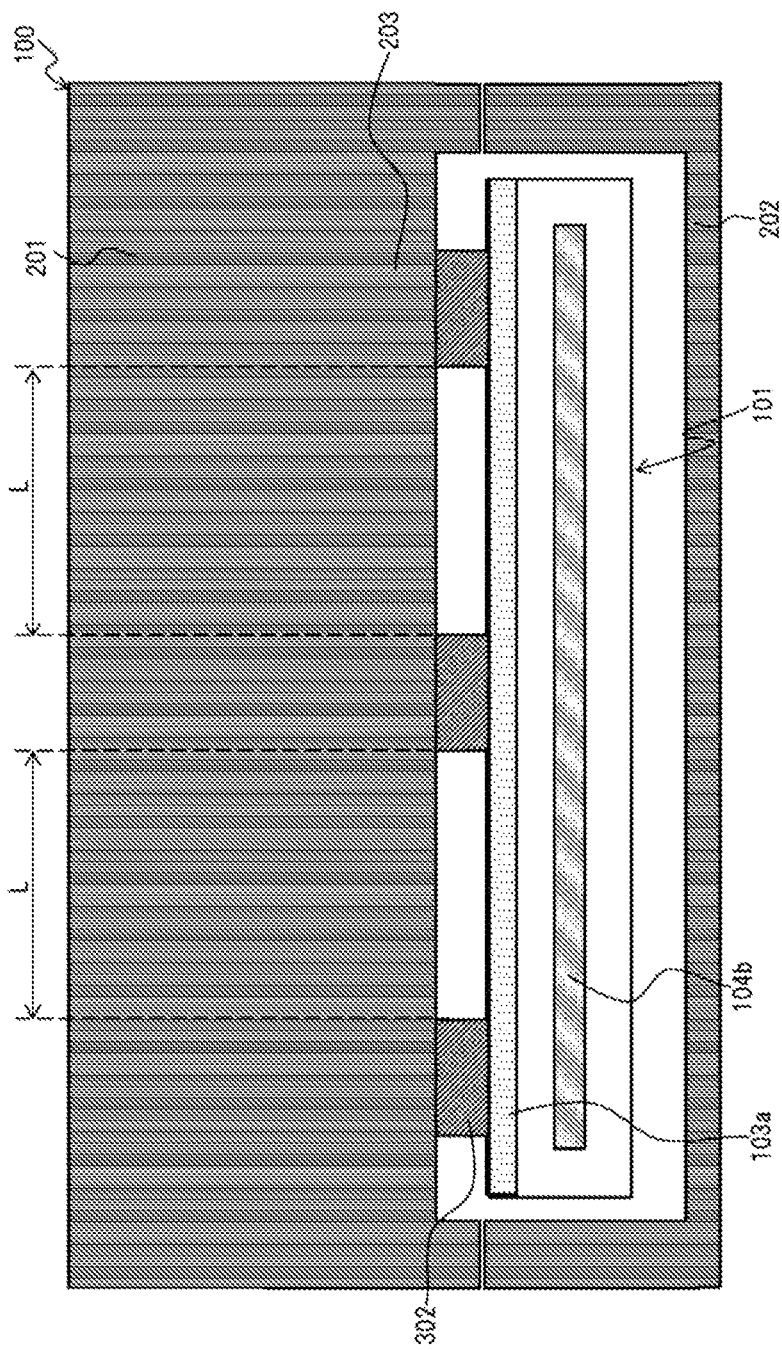
FIG. 11 is a cross-sectional view in a plane along a partition wall of the electronic control device according to the fourth embodiment.

FIG. 10 is a top view of a printed board of the electronic control device according to the present embodiment, and FIG. 11 is a cross-sectional view in a plane along a partition wall of the electronic control device.

The conductive gaskets 302 of the electronic control device 4 are disposed such that a relationship between an interval (hereinafter, distance L) between the conductive gaskets 302 and a wavelength $\lambda$ satisfies $\lambda/2 > L$. The distance L is a distance of a longest portion in a cross section on a plane along the partition wall 203 in a portion (clearance between the partition wall 203 and the printed board 101) where the space in which the electronic circuit 110 is disposed in the housing 100 communicates with the space in which the connector 105 is disposed. The wavelength $\lambda$ is a wavelength of radiation noise due to driving of the electronic circuit 110.

As described above, the distance L is set to be shorter than ½ of the wavelength of the frequency of the radiation noise for which suppression (attenuation) is desired, and thus, the radiation noise emitted by the driving of the electronic circuit 110 is attenuated by the partition 203.

Other configurations are similar to the configurations of the third embodiment.

In the present embodiment having the above-described configuration, the same effects as the effects of the third embodiment can be obtained.

As compared with the third embodiment, the number of conductive gaskets 302 can be reduced, and the cost can be reduced.

Fifth Embodiment

Hereinafter, a fifth embodiment of the present invention will be described with reference to FIGS. 12 and 13. In the present embodiment, only differences from the fourth embodiment will be described, and in the drawings used in the present embodiment, the same members as the members of the fourth embodiment are denoted by the same reference signs, and description thereof will be omitted.

In an electronic control device 5 of the present embodiment, a frame ground 103a and a housing 100 are DC-coupled with a screw as an example of a "second coupling member".

Figure 12:
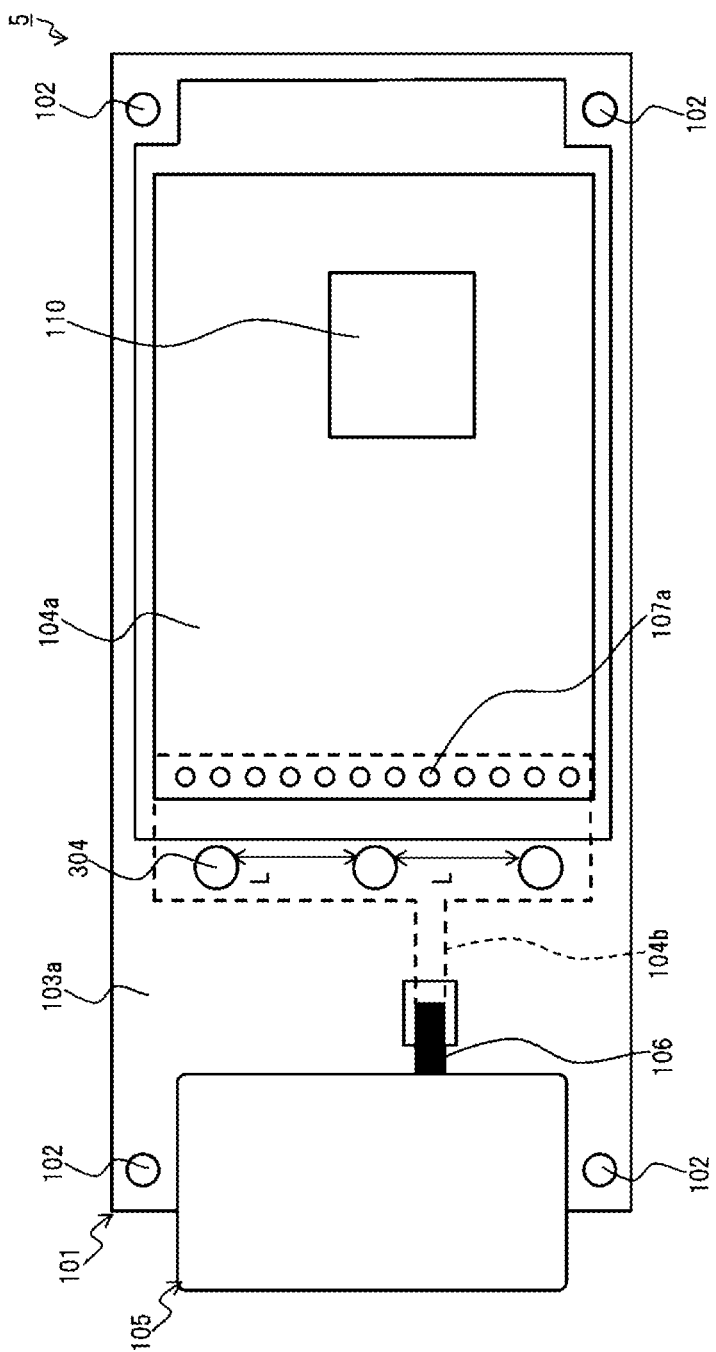
FIG. 12 is a top view of a board of an electronic control device according to a fifth embodiment.
Figure 13:
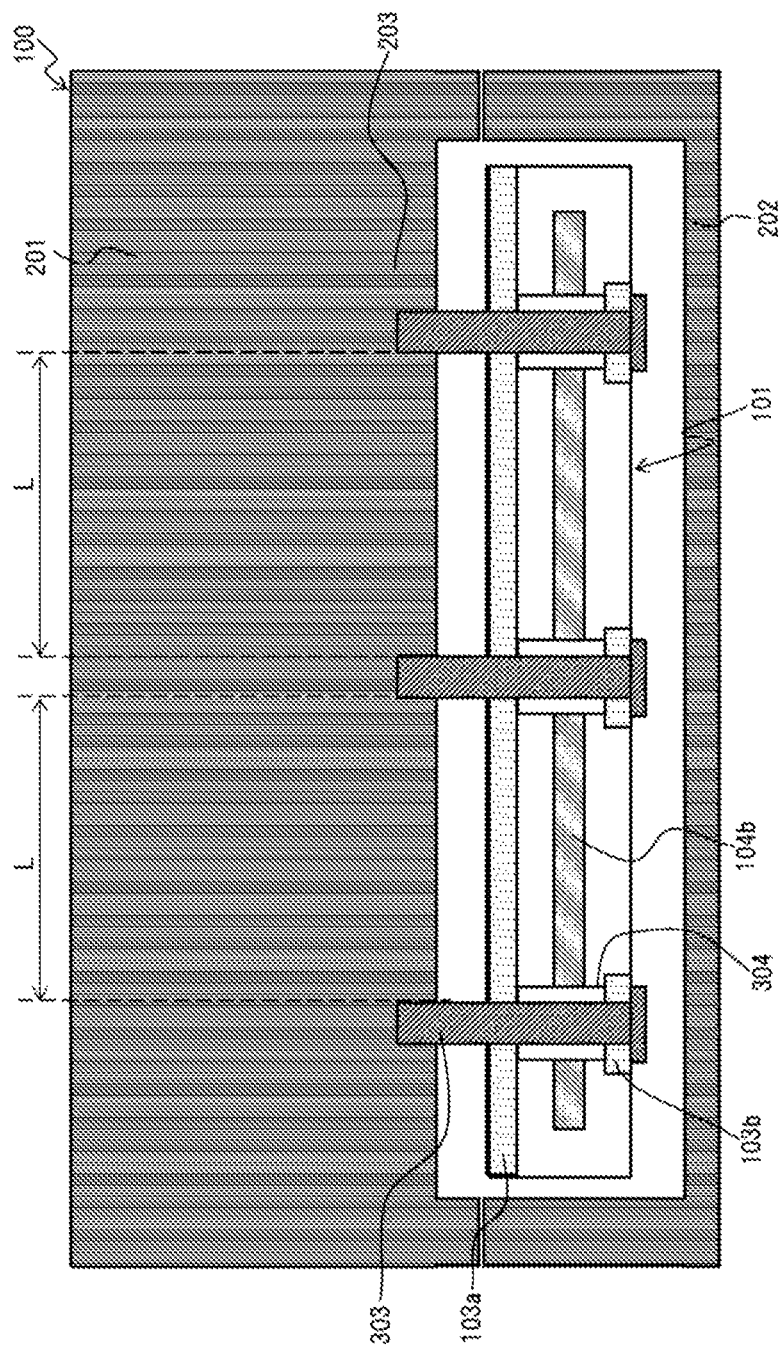
FIG. 13 is a cross-sectional view in a plane along a partition wall of the electronic control device according to the fifth embodiment.

FIG. 12 is a top view of a printed board of the electronic control device according to the present embodiment, and FIG. 13 is a cross-sectional view in a plane along a partition wall of the electronic control device.

In FIG. 13, a plurality of screw holes 304 are formed in a projection region of a partition wall 203 in a printed board 101. The frame ground 103a on an upper surface of the printed board 101 and a frame ground 103b on a lower surface of the printed board 101 are electrically coupled with screw holes 304. The printed board 101 and the partition wall 203 are fixed with metal screws 303 through screw holes 304, and thus, the frame ground 103 of the printed board 101 and the partition wall 203 are DC-coupled and have the same potential.

Other configurations are similar to the configurations of the fourth embodiment.

In the present embodiment having the above-described configuration, the same effects as the effects of the fourth embodiment can be obtained.

As compared with the fourth embodiment, the frame ground 103a of the printed board 101 and the housing 100 are DC-coupled with the screws 303, and thus, the cost can be reduced.

Sixth Embodiment

Hereinafter, a sixth embodiment of the present invention will be described with reference to FIGS. 14 and 15. In the present embodiment, only differences from the third embodiment will be described, and in the drawings used in the present embodiment, the same members as the members of the third embodiment are denoted by the same reference signs, and description thereof will be omitted.

In an electronic control device 6 of the present embodiment, a frame ground 103a of a printed board 101 and a housing 100 are DC-coupled with a capacitive coupling member 301 instead of the screws of the third embodiment.

Figure 14:
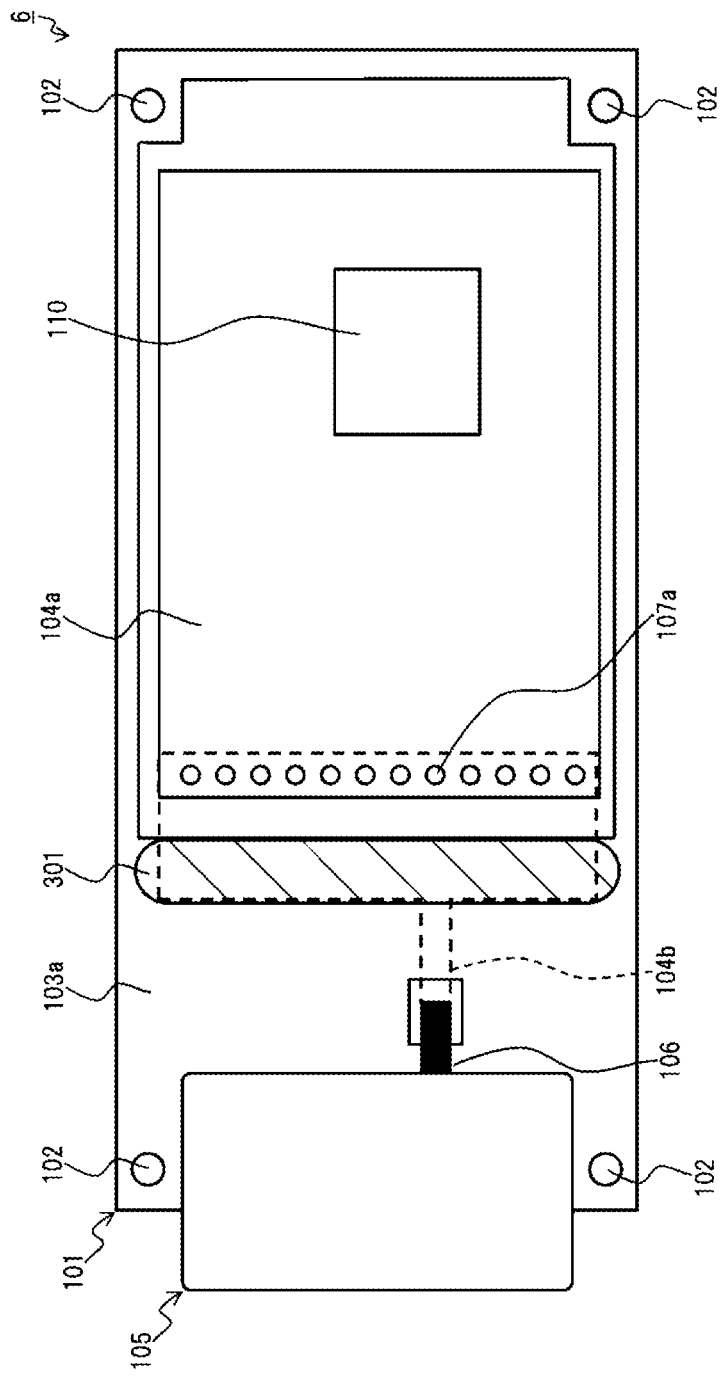
FIG. 14 is a top view of a board of an electronic control device according to a sixth embodiment.
Figure 15:
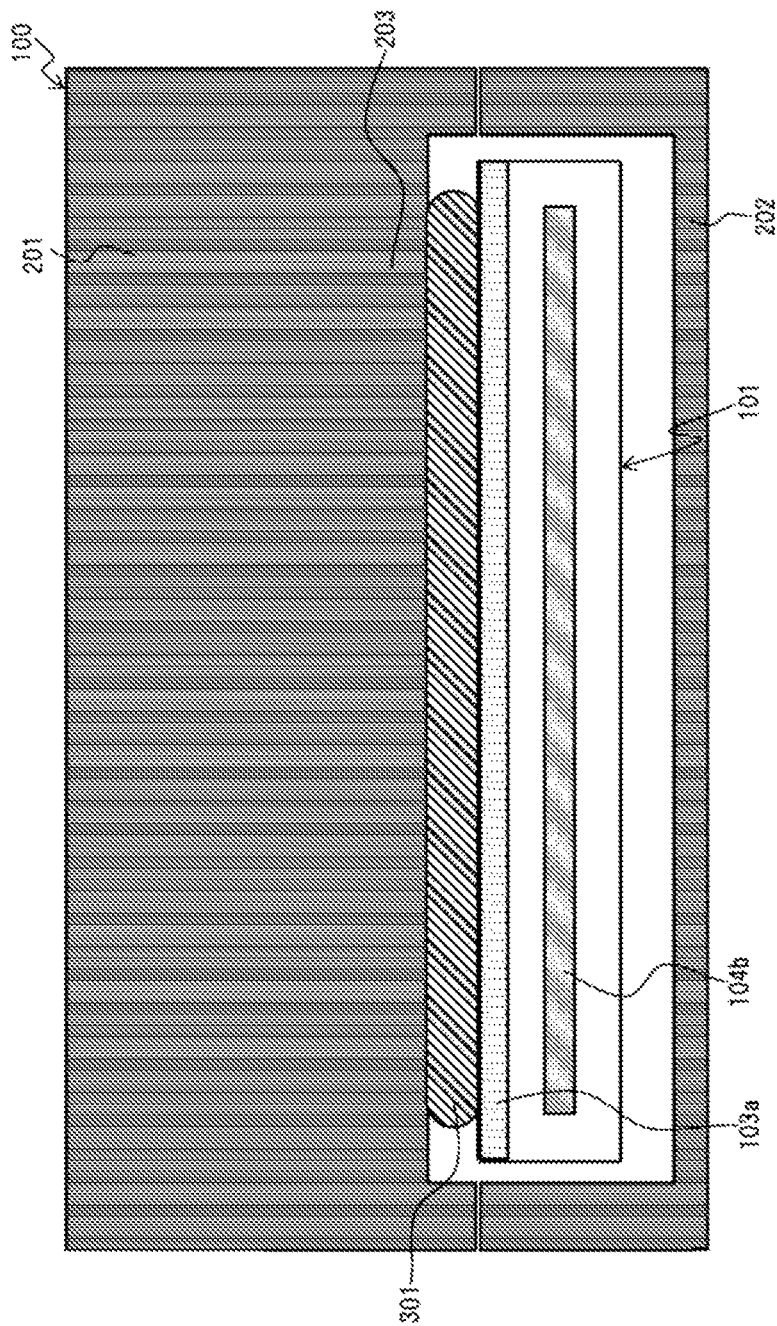
FIG. 15 is a cross-sectional view in a plane along a partition wall of the electronic control device according to the sixth embodiment.

FIG. 14 is a top view of the printed board of the electronic control device according to the present embodiment, and FIG. 15 is a cross-sectional view in a plane along a partition wall of the electronic control device.

The electronic control device 6 AC-couples a partition wall 203 with the frame ground 103*a* of the printed board 101 with the capacitive coupling member 301.

Other configurations are similar to the configurations of the third embodiment.

In the present embodiment having the above-described configuration, the same effects as the effects of the third embodiment can be obtained.

As compared with the third embodiment, the capacitive coupling member 301 (for example, grease) is used instead of the gasket, and thus, the cost can be reduced.

Seventh Embodiment

A seventh embodiment of the present invention will be described with reference to FIG. 1. In the present embodiment, only differences from the second embodiment will be described, and in the drawings used in the present embodiment, the same members as the members of the second embodiment are denoted by the same reference signs, and description thereof will be omitted.

Figure 16:
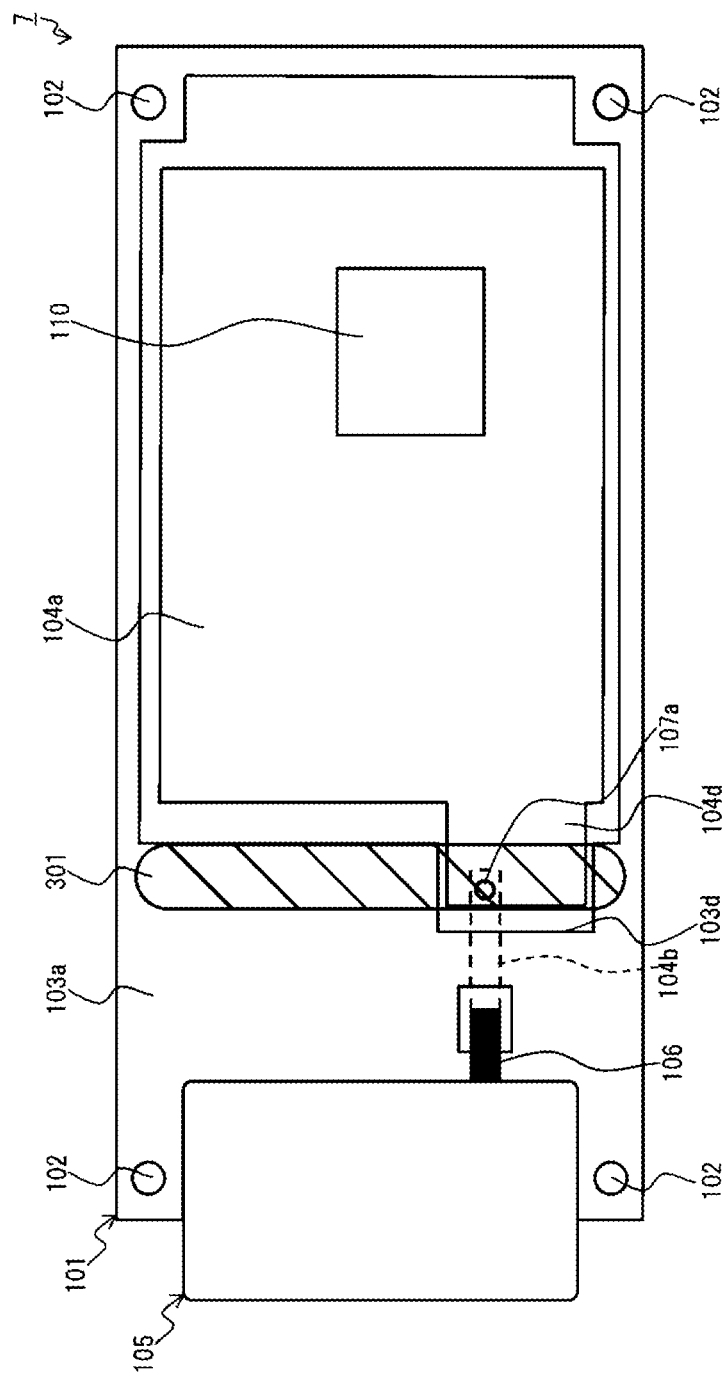
FIG. 16 is a top view of a board of an electronic control device according to a seventh embodiment.

FIG. 16 is a top view of a board of an electronic control device according to the seventh embodiment.

In the electronic control device 2 of the second embodiment, in the projection region of the partition wall 203, the plurality of convex portions 104*d* are provided in the signal ground 104*a* of the printed board 101, and the plurality of concave portions 103*d* into which each of the convex portions 104*d* is insertable are provided in the frame ground 103*a* of the printed board 101. The present invention is not limited thereto, and in an electronic control device 7, in a projection region of a partition wall 203, convex portions 104*d* may be provided on one side (in FIG. 16, a lower side) of a signal ground 104*a* of a printed board 101, and a plurality of concave portions 103*d* into which each of the convex portions 104*d* is insertable may be provided on one side (in FIG. 16, a lower side) of a frame ground 103*a* of the printed board 101.

As a result, the convex portions 104*d* and the concave portions 103*d* can easily be provided in the printed board 101.

Eighth Embodiment

An eighth embodiment of the present invention will be described with reference to FIG. 1. In the present embodiment, only differences from the second embodiment will be described, and in the drawings used in the present embodiment, the same members as the members of the second embodiment are denoted by the same reference signs, and description thereof will be omitted.

Figure 17:
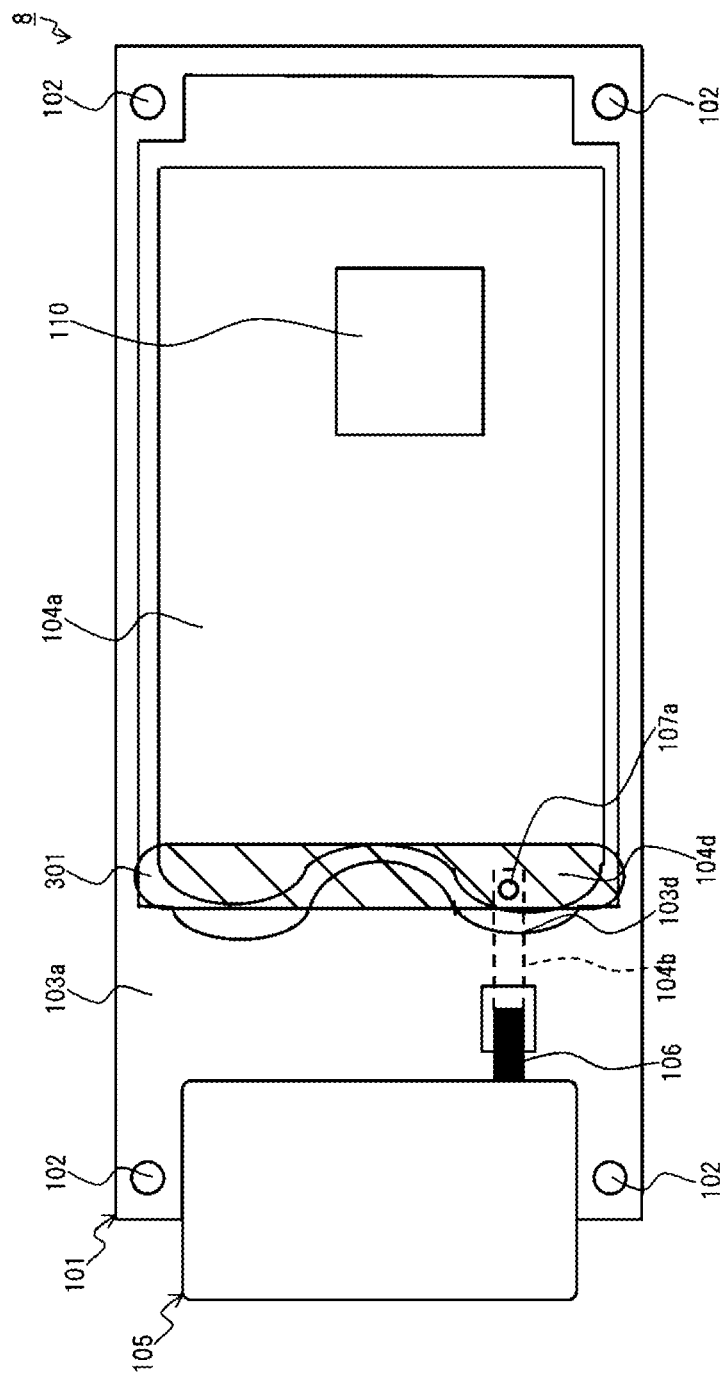
FIG. 17 is a top view of a board of an electronic control device according to an eighth embodiment.

FIG. 17 is a top view of a board of an electronic control device according to the eighth embodiment.

In an electronic control device 8, in a projection region of a partition wall 203, a plurality of arc-shaped convex portions 104*d* may be provided on one side (in FIG. 17, a left side) of a signal ground 104*a* of a printed board 101, and a plurality of arc-shaped concave portions 103*d* into which each of the convex portions 104*d* is insertable may be provided on one side (in FIG. 17, a right side) of a frame ground 103*a* of the printed board 101.

Ninth Embodiment

A ninth embodiment of the present invention will be described with reference to FIG. 1. In the present embodiment, only differences from the second embodiment will be described, and in the drawings used in the present embodiment, the same members as the members of the second embodiment are denoted by the same reference signs, and description thereof will be omitted.

Figure 18:
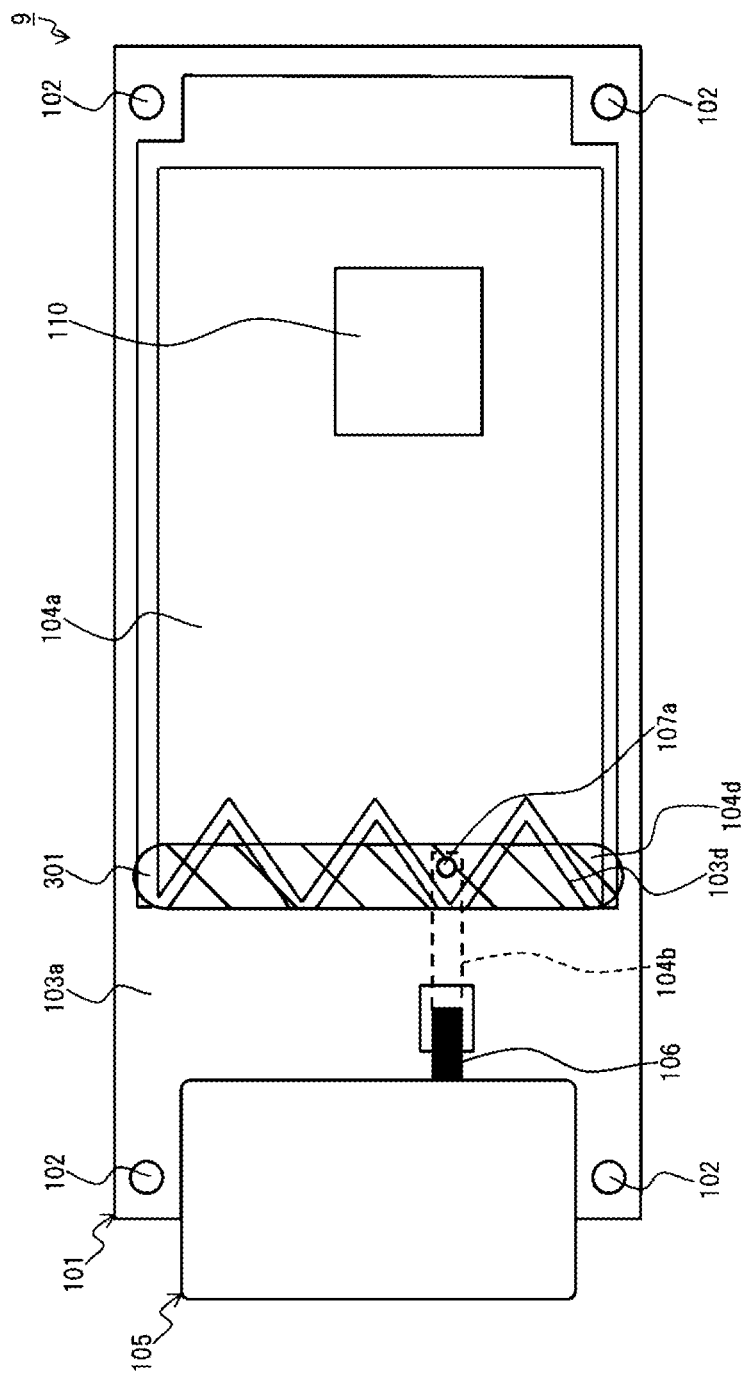
FIG. 18 is a top view of a board of an electronic control device according to a ninth embodiment.

FIG. 18 is a top view of a board of an electronic control device according to the ninth embodiment.

In an electronic control device 9, in a projection region of a partition wall 203, a plurality of cutout convex portions 104*d* may be provided on one side (in FIG. 18, a left side) of a signal ground 104*a* of a printed board 101, and a plurality of cutout concave portions 103*d* into which each of the convex portions 104*d* is insertable may be provided on one side (in FIG. 18, a right side) of a frame ground 103*a* of the printed board 101.

APPENDIX

The present invention is not limited to the above embodiments, and includes various modifications and combinations without departing from the gist of the present invention. The present invention is not limited to include all the configurations described in the above embodiments, and includes one in which a part of the configurations is deleted.

REFERENCE SIGNS LIST

1, 2, 3, 4, 5, 6, 7, 8, 9 electronic control device
100 housing
101 printed board
103, 103*a*, 103*b* frame ground
103*d* concave portion
104, 104*a*, 104*b*, 104*c* signal ground
104*d* convex portion
105 connector
110 electronic circuit
203 partition wall
301 capacitive coupling member
302 conductive gasket
303 screw
304 screw hole

The invention claimed is:

1. An electronic control device which includes a circuit board having signal grounds and frame grounds, a housing accommodating the circuit board, and a connector mounted on the circuit board, the electronic control device comprising:
a first coupling portion which AC-couples the signal ground with the frame ground; and
a second coupling portion which electrically couples the frame ground with the housing, wherein:
the first coupling portion and the second coupling portion are provided between the connector and a noise source on the circuit board;
a protrusion portion protruding toward an inside of the housing is provided in the housing,
a part of the signal grounds and a part of the frame grounds are disposed in a projection region of the protrusion portion in the circuit board with a gap to be separated from the protrusion portion, and
the first coupling portion and the second coupling portion are formed by a single capacitive coupling member provided at least at a part of the gap.

2. The electronic control device according to claim 1, wherein a convex portion is provided in at least one of the signal ground and the frame ground, and a concave portion to which the convex portion is insertable is provided in the other of the signal ground and the frame ground, and at least a part of the convex portion and at least a part of the concave portion are disposed in the projection region of the protrusion portion in the circuit board.

3. The electronic control device according to claim 2, wherein a plurality of the convex portions are provided in at least one of the signal ground and the frame ground, and a plurality of the concave portions are provided in the other of the signal ground and the frame ground.

4. The electronic control device according to claim 1, wherein the circuit board is formed by a plurality of layers, the second coupling portion is formed by a capacitive coupling member which AC-couples the frame ground with the housing, and the first coupling portion is formed by a layer of the signal ground and a layer of the frame ground being separated from each other among the layers of the circuit board.

5. The electronic control device according to claim 1, wherein the noise source is a radio-frequency driving microcomputer.

6. An electronic control device which includes a circuit board having signal grounds and frame grounds, a housing accommodating the circuit board, and a connector mounted on the circuit board, the electronic control device comprising:

a first coupling portion which AC-couples the signal ground with the frame ground;

a second coupling portion which electrically couples the frame ground with the housing; and a plurality of the DC coupling members, wherein:

the first coupling portion and the second coupling portion are provided between the connector and a noise source on the circuit board;

the circuit board is formed by a plurality of layers, the second coupling portion is formed by a DC coupling member which DC-couples the frame ground with the housing, the first coupling portion is formed by a layer of a signal ground and a layer of a frame ground being separated from each other among the plurality of layers, and the plurality of DC coupling members are disposed at an interval equal to or less than ½ of a noise wavelength generated from the noise source.

7. The electronic control device according to claim 6, wherein the DC coupling member is a conductive gasket.

8. The electronic control device according to claim 6, wherein a screw hole is provided in the circuit board, and the DC coupling member is a screw to be attached to the screw hole.

* * * * *